United States Patent [19]
Koike et al.

[11] Patent Number: 5,625,616
[45] Date of Patent: Apr. 29, 1997

[54] DETERIORATION ESTIMATING METHOD FOR A LIGHT EMITTING DEVICE AND A LIGHT EMISSION DRIVING APPARATUS USING THE METHOD

[75] Inventors: Shigeaki Koike; Masaru Tezuka; Shinji Kaneko; Yoshizo Mihara, all of Kanagawa, Japan

[73] Assignee: Sony Corporation, Tokyo, Japan

[21] Appl. No.: 627,122

[22] Filed: Apr. 3, 1996

[30] Foreign Application Priority Data

Apr. 5, 1995 [JP] Japan ................................. 7-080460

[51] Int. Cl.$^6$ ............................................. G01B 7/125
[52] U.S. Cl. ................. 369/116; 369/121; 369/54; 372/33; 372/34
[58] Field of Search ......................... 369/116, 112, 369/121, 122, 123, 124, 54, 58, 47; 372/33, 34, 36

[56] References Cited

U.S. PATENT DOCUMENTS 5,436,880  7/1995  Eastman et al. ......................... 369/54

*Primary Examiner*—Muhammad N. Edun
*Attorney, Agent, or Firm*—Limbach & Limbach L.L.P.

[57] ABSTRACT

A current detector detects a driving current Im flowing through a light emitting device (laser diode); a temperature sensor is arranged in the vicinity of the light emitting device; a microcomputer is supplied with the outputs of the current detector and temperature sensor; a temperature correction coefficient specific to the light emitting device, obtained based on a driving current value IT1 at a temperature T1 and a driving current value IT2 at a temperature T2 (>T1), is stored in memory; a deterioration threshold current Id for a detected temperature Ti is calculated; and when the deterioration threshold current Id for the detected temperature Ti is exceeded by the detected current, a driver is controlled so as to inhibit the supply of the driving current to the light emitting device. Since the operating temperature also is taken into consideration, deterioration of the light emitting device can be accurately estimated, thereby preventing erroneous recording/reproduction of data.

22 Claims, 3 Drawing Sheets

| LD No. | I 25 | I 45 | η (mA/°C) |
|---|---|---|---|
| 1 | 82.3 | 97.0 | 0.735 |
| 2 | 90.4 | 101.0 | 0.530 |
| 3 | 85.9 | 108.6 | 1.135 |
| 4 | 86.4 | 103.5 | 0.855 |

η : TEMPERATURE CORRECTION COEFFICIENT $$\left( \begin{array}{l} \eta = \dfrac{IT2 - IT1}{T2 - T1} (mA/°C) \\ IT1 : \text{OPERATING CURRENT AT T1} \\ IT2 : \text{OPERATING CURRENT AT T2} \end{array} \right)$$

I 25 : OPERATING CURRENT AT 25°C
I 45 : OPERATING CURRENT AT 45°C

| LD No. | I d1 | I d2 | I d1/ I 45 | I d2/ I 45 |
|---|---|---|---|---|
| 1 | 118.0 | 116.4 | 1.22 | 1.2 |
| 2 | 127.7 | 121.2 | 1.26 | 1.2 |
| 3 | 122.3 | 130.3 | 1.13 | 1.2 |
| 4 | 122.9 | 124.2 | 1.19 | 1.2 |

I d1, I d2 : DETERIORATION THRESHOLD CURRENT $$\begin{pmatrix} I\,d1 : (I\,o + \eta \times 20) \times 1.2 \\ I\,d2 : (I\,o + \eta' \times 20) \times 1.2 \end{pmatrix}$$

$\eta$ : AVERAGE TEMPERATURE CORRECTION COEFFICIENT $\eta'$ : SPECIFIC TEMPERATURE CORRECTION COEFFICIENT

I0 : OPERATING CURRENT AT ORDINARY TEMPERATURE (25°C)

DETERIORATION ESTIMATING METHOD FOR A LIGHT EMITTING DEVICE AND A LIGHT EMISSION DRIVING APPARATUS USING THE METHOD

BACKGROUND OF THE INVENTION

1. Field of the Invention

This invention relates to a method of estimating deterioration of a light emitting device used in a magneto-optical recording/reproducing system using a magneto-optic disc, and a light emission driving apparatus employing the method.

2. Description of the Related Art

In a magneto-optical recording/reproducing system using a magneto-optic disc, for example, a laser diode (LD) using a semiconductor, etc. is used as a light emitting device of optical pickup means. The laser diode is excited (driven) by a driving signal which is based on data supplied from driving means associated therewith, to provide a predetermined light output. The predetermined output light is irradiated onto a magneto-optic disc to record data thereon, and another predetermined output light is irradiated onto the magneto-optic disc to read out data recorded thereon.

The laser diode deteriorates with time, and after being used longer than a certain period of time, it fails to provide the required light output. Specifically, as shown in FIG. 6, a driving current I required to obtain an identical light output Pw tends to rise with an increase in the amount t of time used, and the light output shows a tendency to sharply drop when a certain driving current is exceeded.

Therefore, some laser diode makers employ a policy to specify the term of guarantee, with a view to warning that the laser diode should be replaced when the term of guarantee has elapsed. Depending on users, on the other hand, they may continue to use a laser diode and replace it only when data recording becomes unavailable.

The term of guarantee is set taking account of variations of individual laser diodes. Thus, some laser diodes are fully usable even after the term of guarantee has expired, and in this case, the term setting merely forces wasteful and uneconomical use of laser diodes.

In the case of replacing a laser diode only when data recording becomes unavailable, the laser diode can be used up, but there is a possibility that the service life of the laser diode suddenly comes to an end and fails to emit light with sufficient intensity while data is actually recorded or reproduced. If this occurs, it is necessary to check, for example, recorded data again to determine to which point data has been effectively recorded, requiring much labor.

SUMMARY OF THE INVENTION

The present invention was created to solve the above problems, and provides a method of estimating deterioration of a light emitting device and a light emission driving apparatus using the method, which take advantage of the fact that in most cases the light output of a light emitting device sharply drops when a driving current required to obtain a certain output of the device rises up to a specific value relative to a predetermined driving current value, to thereby perform electronic deterioration monitoring, whereby deterioration of the light emitting device in use can be estimated as accurately as possible by the method so that the light emission can be, for example, inhibited by the driving apparatus.

According to the present invention, a driving current value required to provide a specific light output is used as a reference value, and a driving current which is n times the reference value is used as a deterioration threshold current indicative of the need for replacement of the light emitting device, to thereby estimate deterioration of the light emitting device.

In the case where the driving current value required to provide the specific light output is used as the reference value, a correction current value which is an average temperature correction coefficient may be added to the reference value and a driving current value which is n times the thus-corrected reference value may be used as the deterioration threshold current indicative of the need for replacement of the light emitting device, to thereby estimate deterioration of the light emitting device.

Also, in the case where the driving current value required to provide the specific light output is used as the reference value, a correction current value which is a temperature correction coefficient specific to the light emitting device may be added to the reference value and a driving current value which is n times the thus-corrected reference value may be used as the deterioration threshold current indicative of the need for replacement of the light emitting device, to thereby estimate deterioration of the light emitting device.

According to another aspect of the present invention, a light emission driving apparatus comprises a light emitting device, a current detector for detecting the driving current flowing through the light emitting device, a temperature sensor arranged in the vicinity of the light emitting device, and a control section for the light emitting device, to which the outputs of the current detector and temperature sensor are supplied, wherein a temperature correction coefficient specific to the light emitting device, obtained based on the driving current value at a temperature T1 and the driving current value at a temperature T2 (>T1), is stored in memory, a deterioration threshold current for a detected temperature Ti is calculated by using the temperature correction coefficient, and when the deterioration threshold current for the detected temperature Ti is exceeded by the detected current, the supply of the driving current to the light emitting device is inhibited.

DESCRIPTION OF THE PREFERRED EMBODIMENTS

Examples of a deterioration estimating method for a light emitting device and a light emission driving apparatus using the method, according to this invention, will be now described in detail with reference to the drawings which illustrate the case where the invention is applied to the aforementioned recording/reproducing system using a magneto-optic disc.

Figures 5, 6:
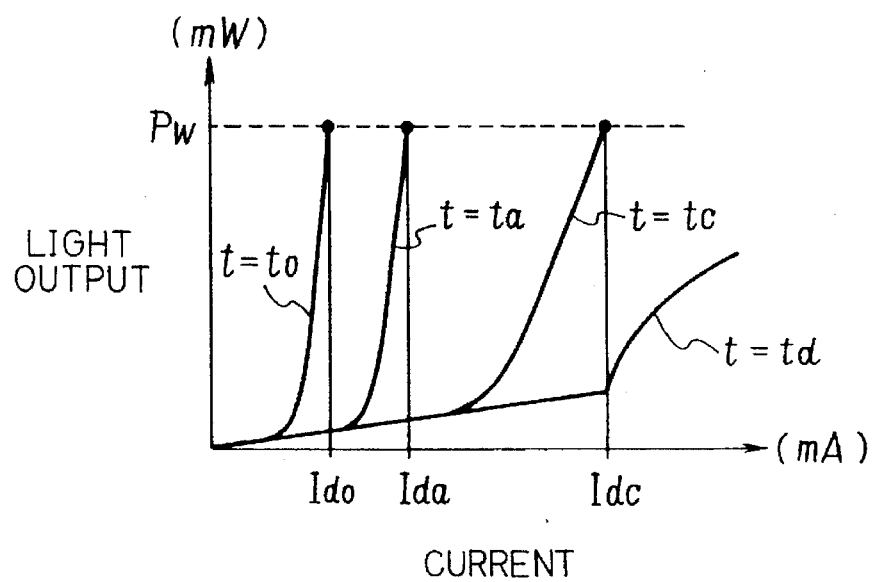
FIG. 5 is a chart showing the relationship between average temperature correction coefficient and specific temperature correction coefficient.
FIG. 6 is a graph showing the relationship between operating time and driving current.

An outline of the invention will be explained first. In the following description, a laser diode, or more particularly a semiconductor laser diode, is taken as an example of a light emitting device, but the light emitting device to be used is not limited to such diodes and may be a light emitting diode, for example. Deterioration of this type of laser diode varies with time, and a driving current required to provide a specified light output (laser power of, e.g., 20 mW) rises with an increase in the amount of time used (accumulated current supply time), as shown in FIG. 6. It is known that the driving current increases in proportion to the square root of the current supply time.

In the case of a laser diode (AlGaAs, AlGaInP, etc.) having a wavelength λ of 680 to 800 nm, provided a reference value equals an initial value IO (driving current value required to provide a light output of, e.g., 20 mW at ordinary temperature), if an electric current which is 1.2 to 1.3 times the reference value IO flows through the diode, the light output sharply drops thereafter. The current supply time, in this case, is approximately 5000 hours.

For such a laser diode, therefore, 1.2 IO is set as a deterioration threshold current Id, the current flowing through the laser diode is detected, and when the detected driving current Im has become greater than the deterioration threshold current Id, use of the laser diode is inhibited. While inhibiting use of the laser diode, information to this effect is displayed on a panel, thereby informing the operator that the laser diode should be replaced with a new one. Accordingly, the laser diode can be replaced before its light output sharply drops and the recording and reproduction of data become unavailable. This process makes it possible to prevent erroneous recording/reproduction.

Figures 3, 4:
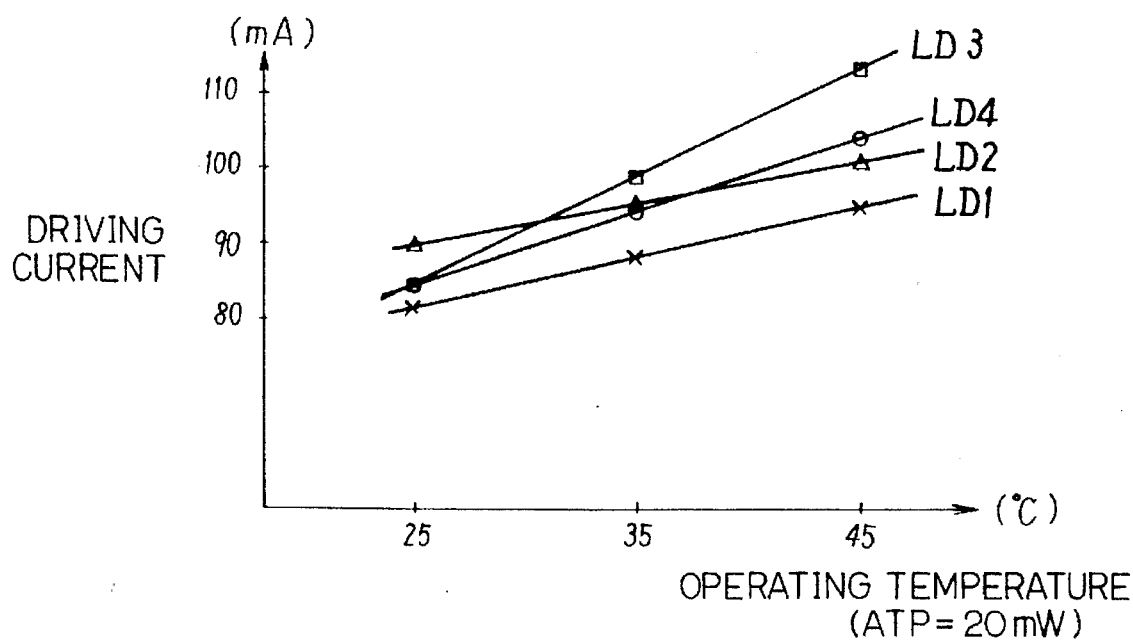
FIG. 3 is a graph showing the relationship between operating temperature and driving current.
FIG. 4 is a chart showing the relationship between driving current and temperature correction coefficient.

According to experimentation, it was found that the driving current of a laser diode was influenced also by the operating temperature of the diode itself. FIG. 3 illustrates an example of such experimental data.

As will be understood from the figure, the value of the driving current flowing through a laser diode increases as the operating temperature rises. Therefore, if the deterioration threshold value Id is set based solely on the reference value IO, there is a possibility that the laser diode is judged to be deteriorated in the case where the operating temperature of the laser diode is higher than the operating temperature associated with the reference value IO, though the degree of deterioration of the laser diode is actually outside the range of deterioration. Thus, it is desirable that the deterioration threshold current for a laser diode be set taking the operating temperature into consideration. An example of calculating a temperature correction coefficient η based on the operating temperature will be explained.

FIG. 4 illustrates the relationship between individual laser diodes and their temperature correction coefficients η, and in the illustrated example, each temperature correction coefficient η is calculated based on driving currents I25 and I45 at operating temperatures T1=25° C. (ordinary temperature) and T2=45° C., respectively. The temperature correction coefficient η is given by the following equation:

$$\eta = (IT2-IT1)/(T2-T1)$$
$$= (I45-I25)/(T2-T1) \text{ (mA/°C.)} \quad (1)$$

As seen from FIG. 4, the temperature correction coefficient η for the laser diode LD2 is 0.530, and the temperature correction coefficient η for the laser diode LD3 is 1.135. Averaging these coefficients provides $$\eta = 0.8 \text{ to } 0.9 \quad (2).$$

In this example, the temperature correction coefficient η was set to 0.8. Namely, the average temperature correction coefficient η, in this case 0.8, is used as the temperature correction coefficient for all laser diodes.

Subsequently, the deterioration threshold current Id is calculated using the average temperature correction coefficient η. The deterioration threshold current Id was calculated according to the following equation:

$$Id = \{IO + \eta(T2-T1)\} \times 1.2 \quad (3)$$

Given T2=45° C., T1=25° C., and the values shown in FIG. 4 are used as the respective driving currents IO at T1=25° C. (ordinary temperature), deterioration threshold currents Id as shown in FIG. 5 are obtained (wherein Id1 indicates values calculated using the average temperature correction coefficient).

Where the influence of operating temperature is taken into consideration in this manner, different deterioration threshold currents Id1 are set according to variations of the individual laser diodes to be used, as shown in FIG. 5, and it is possible to estimate the state or degree of deterioration by means of the deterioration threshold current Id1 matching the laser diode which is in use. Also in the case of deterioration estimation using the average temperature correction coefficient η, the driving current of the laser diode is detected, and when its value Im has become greater than the deterioration threshold current Id1, similar measures to those described above are taken to thereby prevent erroneous recording/reproduction of data.

Meanwhile, as seen from the temperature characteristics shown in FIG. 3, the influence of operating temperature upon driving current differs from one laser diode to another, and in the illustrated example, the influence is the greatest for the laser diode LD3 and is the smallest for the laser diode LD2. Therefore, different deterioration threshold currents Id1 are set for different laser diodes. Ideally, however, the temperature correction coefficients specific to the individual laser diodes should most preferably be used to set the respective deterioration threshold currents, as described below.

The relationship between the individual laser diodes and their temperature correction coefficients is shown in FIG. 4, as mentioned above. Although the figure shows the temperature correction coefficients for T2=45° C. and T1=25° C., the values do not vary greatly at other temperatures. Using the specific temperature correction coefficients (hereinafter indicated by η'), deterioration threshold currents Id2 are obtained according to the following equation:

$$Id = \{IO + \eta'(T2-T1)\} \times 1.2 \quad (4)$$

Given T2=45° C., T1=25° C., and the values shown in FIG. 4 are used as the respective driving currents IO (=I25) at T1=25° C. (ordinary temperature), deterioration threshold currents Id2 as shown in FIG. 5 are obtained.

In the case of the laser diodes LD1 and LD2, the deterioration threshold currents Id2 obtained using the respective specific temperature correction coefficients η' are smaller than those obtained using the average temperature correction coefficient η. This is because the relationship η>η' stands for the laser diodes LD1 and LD2, and in such cases the ratio (Id2/I45) of the deterioration threshold current to the current I45 at T2=45° C. exceeds a deterioration criterion multiple n (=1.2). Therefore, it is highly possible that the deterioration threshold currents Id1 shown in FIG. 5 are themselves greater than critical values, increasing the probability that the light output sharply drops before the values Id1 are reached. Preferably, therefore, the use of the laser diode should be stopped before the value Id1 is reached. In the case where the specific temperature correction coefficients η' are used, the deterioration criterion multiple n is never exceeded, thus ensuring safety.

For the laser diodes LD3 and LD4, the case is entirely different from, or opposite to, the diodes LD1 and LD2. Namely, in the case of using the laser diode LD3 or LD4, deterioration is signaled uneconomically before the service life comes to an end. By employing the specific temperature correction coefficient η', the laser diode can be used up to the time the deterioration criterion multiple n is exceeded, because the deterioration threshold current Id2 as the critical value can advantageously be set to a value greater than Id1. Thus, it is best to use the specific temperature correction coefficients η for estimating the deterioration.

Figure 1:
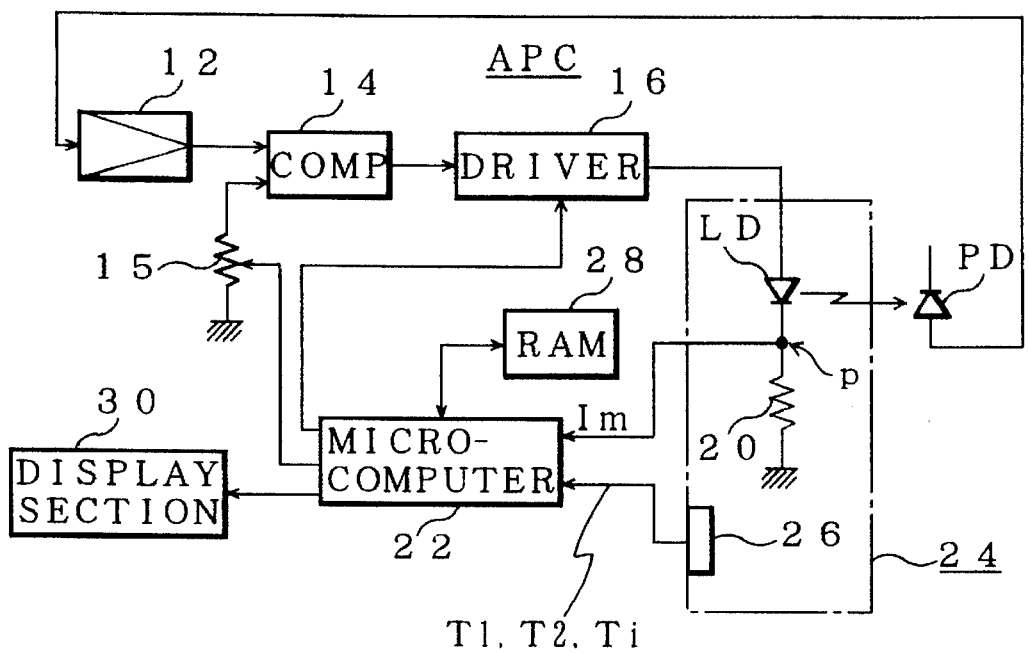
FIG. 1 is a schematic diagram showing an example of application of a light emission driving apparatus according to this invention to an APC system.

FIG. 1 illustrates a specific example of a light emission driving apparatus 10 for carrying out the optimum deterioration estimation described above, wherein the apparatus is applied to an APC system for a laser diode LD. APC denotes Automatic Power Control, and the APC system is a laser control system for performing a control operation such that data can be recorded with a constant laser power or light output all the time during data recording.

The luminous energy of the laser diode LD is detected by a photodetector, in this example, a photodiode PD, the detection output of which is then supplied to a comparator 14 via an amplifier 12 to be compared with a reference level (derived from a reference power generator 15). The reference level indicates a value with which the laser diode is to be driven to provide the optimum light output during recording, as mentioned above. The comparison output is supplied to a driver 16, and the driving current for the laser diode LD connected to the output terminal of the driver is controlled so that the laser diode may provide the optimum light output.

According to this invention, means for detecting the current of the laser diode LD is provided in addition to the above-described arrangement. In the illustrated example, a resistor 20 is used as a current detector. The resistor 20 is connected in series with the current path of the laser diode LD, and a voltage corresponding the current Im appearing at the junction p is applied to a microcomputer 22 constituting a control section.

Also, a temperature sensor 26 for detecting the operating temperature of the laser diode LD is mounted on a substrate (assembly substrate) 24 on which the laser diode LD is mounted, at a location close to the laser diode LD. The sensor output from the temperature sensor 26 is supplied to the microcomputer 22. The temperature sensor 26 detects the ambient temperature of the laser diode LD, but since the value thereof is approximately equal to the operating temperature of the laser diode LD itself, the ambient temperature can be employed as the operating temperature of the laser diode LD.

The microcomputer 22 calculates the temperature correction coefficient η(=η') of the laser diode, shown in FIG. 4. This calculation is performed, for example, when the adjustment of recording waveform etc. is made with the laser diode LD mounted on optical pickup means (not shown), and a driving current IT1 (corresponding to I25) at a temperature (corresponding to T1) before the adjustment and a driving current IT2 (corresponding to I45) at a temperature after the adjustment (i.e., at a temperature corresponding to T2, because the temperature is usually higher than that observed before the adjustment) are obtained. These values can be obtained by detecting the output of the temperature sensor 26 and the current then flowing at the junction p. The temperature T1 is usually equivalent to ordinary temperature, and thus the driving current value IT1 is used also as the reference value I0.

After the temperatures and the driving currents are obtained in this manner, the temperature correction coefficient η' is calculated, and the calculated value and the driving current I25 (=I0) are stored in a memory, for example, in a RAM (most preferably, a nonvolatile memory) 28. Thereafter, the current Im of the laser diode LD which is in use is measured, and based on a temperature Ti then detected, a deterioration threshold current Id2 for the temperature Ti is obtained by the microcomputer 22 according to equation (4).

When the current Im has become greater than the deterioration threshold current Id2, the microcomputer 22 generates a control signal, by which the driver 16 is controlled so that its driving operation may be inhibited. Consequently, the operation of the laser diode LD stops. Simultaneously with this, a display signal is sent to a display section 30 and information requesting the operator to replace the laser diode LD is displayed.

It will be readily understood that the operating temperature of the laser diode LD at which the current Im exceeds the deterioration threshold current Id2 varies depending on the current supply time of the laser diode LD.

Figure 2:
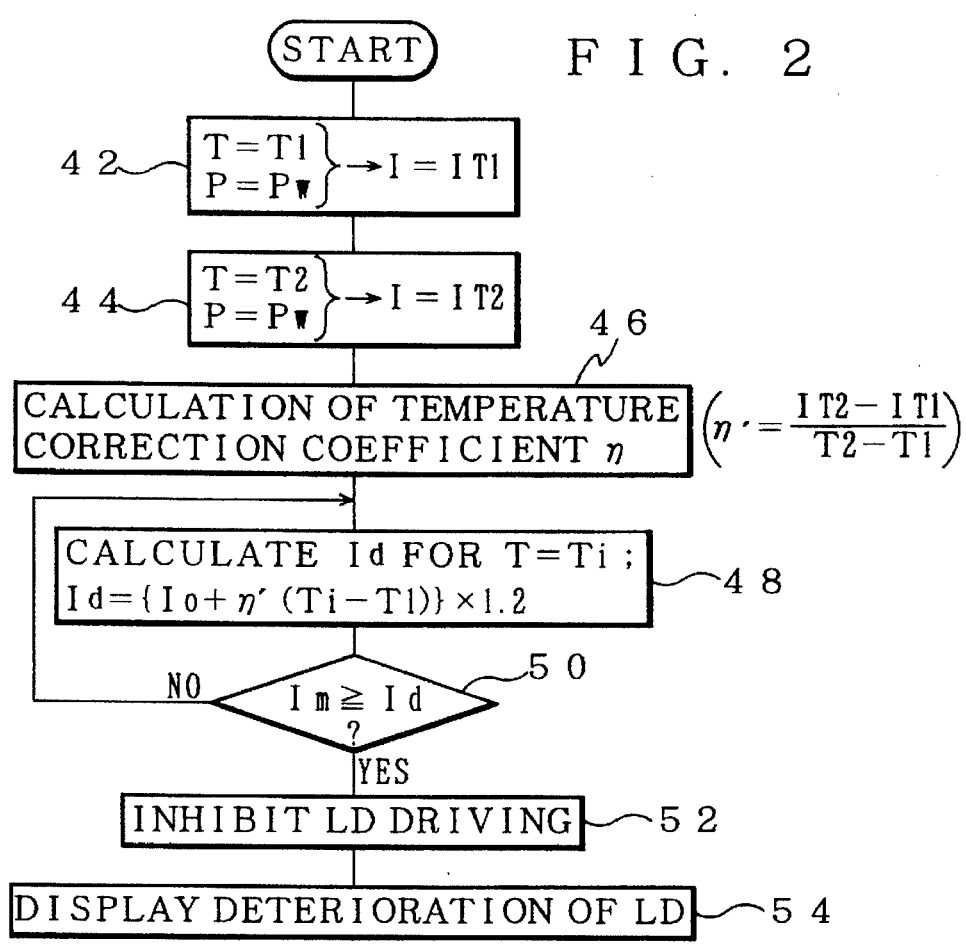
FIG. 2 is a flowchart showing an example of how deterioration of a light emitting device is estimated.

FIG. 2 is a flowchart showing an example of a control program loaded into the microcomputer 22 for achieving the above-described control operation.

First, with the light output P set at a predetermined output Pw, a driving current I=IT1 flowing through the laser diode LD at a temperature T=T1 before the adjustment of recording waveform is obtained, and the individual values are temporarily stored in the memory 28 (Step 42). Similarly, a driving current I=IT2 at a temperature T=T2 after the adjustment of recording waveform is obtained (Step 44). Also in this case, the light output P is subjected to APC (automatic power control) so that it may be equal to Pw. The operating temperatures of the laser diode LD before and after the adjustment of recording waveform are employed because the operating temperature of the laser diode LD should presumably be increased during the course of the adjustment of recording waveform.

The time for obtaining the driving current I is not necessarily restricted to the time before or after the recording waveform adjustment and may be another suitable period of time. For example, in the case where a heater or the like is arranged on the assembly substrate 24 on which the laser diode LD is mounted so that the ambient temperature of the laser diode LD can be forcedly raised by the heater, the operating temperature of the laser diode LD also can be increased, and thus the time period for measuring the driving current is not particularly limited.

After the temperatures T1 and T2 and the driving currents IT1 and IT2 are obtained, the specific temperature correction coefficient η' of the laser diode is calculated according to the aforementioned equation, and the calculated data is stored in the memory 28 (Step 46). It should be noted here that the temperatures T1 and T2 are of course not limited to the temperatures 25° C. and 45° C. shown in FIG. 4, respectively.

The steps explained above constitute a process to be performed before the execution of recording/reproduction mode, and when the recording/reproduction mode is selected, the microcomputer 22 retrieves a temperature Ti then measured, and calculates a deterioration threshold current Id then applicable, according to the aforementioned equation (Step 48). Simultaneously, the microcomputer 22 retrieves a driving current Im then flowing through the laser diode LD and compares Im with Id (Step 50).

If the value of the actually flowing driving current Im is smaller than the deterioration threshold current Id, the recording/reproduction mode is continued. If, on the other hand, the value of the driving current Im at the temperature Ti has become greater than the corresponding deterioration threshold current Id, the driving operation of the laser diode LD is immediately inhibited and information to this effect is displayed at the display section 30 (Steps 52, 54). The process described above makes it possible to forcibly inhibit the driving operation of the laser diode before recording/reproduction is erroneously performed, and also to prompt the operator to replace the laser diode.

Thus, the operating temperature Ti of the laser diode LD is always monitored and the deterioration threshold current Id then applicable is calculated on a real-time basis, whereby deterioration of the laser diode can be estimated with accuracy taking account of the time-varying operating temperature Ti.

The process up to Step 46 in FIG. 2 may be performed once at the time of shipment from an assembly plant, or software may be designed to repeatedly execute the process at predetermined intervals during operation.

As described above, according to the present invention, deterioration of a light emitting device is estimated through monitoring of the value of the driving current of the light emitting device, thus permitting accurate estimation.

Further, since deterioration of the light emitting device is estimated also taking account of the operating temperature of the light emitting device, it is possible to estimate with enhanced accuracy deterioration of the device which is in use. Also, variations in temperature characteristics of individual light emitting devices are taken into account to estimate deterioration of the individual devices, whereby deterioration estimation can be made with even higher accuracy.

Furthermore, the present invention utilizes the deterioration estimation to inhibit the driving operation of the light emitting device which is in use before the light output of the light emitting device sharply drops. This procedure can prevent sudden failure to record data during data recording and also prevent data from being suddenly lost, thus ensuring safety. Also, the light emitting device can be used until its service life almost comes to an end, permitting effective and economical use of the light emitting device. Therefore, the present invention is especially suitably applicable to a recording/reproducing system using a magneto-optic disc which is used for a long term, etc.

What is claimed is:

1. A deterioration estimating method for estimating a state of deterioration of a light emitting device based on a driving current of the light emitting device, comprising the steps of:
   supplying a first driving current such that the light emitting device provides a predetermined light output, and setting the value of the first driving current as a reference value;
   setting a driving current value which is n times the reference value as a deterioration threshold current for determining the state of deterioration of the light emitting device;
   supplying a second driving current such that the light emitting device provides the predetermined light output, and comparing the value of the second driving current with the deterioration threshold current; and
   determining deterioration of the light emitting device in accordance with the result of the comparison.

2. The deterioration estimating method according to claim 1, wherein the light emitting device comprises a laser diode.

3. The deterioration estimating method according to claim 1, wherein the value of n falls within a range of 1.2 to 1.3.

4. The deterioration estimating method according to claim 1, wherein the reference value is a driving current value with which the light emitting device can provide the predetermined light output at ordinary temperature.

5. A deterioration estimating method for estimating a state of deterioration of a light emitting device based on a driving current of the light emitting device, comprising the steps of:
   supplying a first driving current such that the light emitting device provides a predetermined light output, and setting the value of the first driving current as a reference value;
   obtaining a corrected reference value by adding a correction current value to the reference value, the correction current value being an average value of temperature correction coefficients of light emitting devices of a type identical with that of the light emitting device;
   setting a driving current value which is n times the corrected reference value as a deterioration threshold current for determining the state of deterioration of the light emitting device;
   supplying a second driving current such that the light emitting device provides the predetermined light output, and comparing the value of the second driving current with the deterioration threshold current; and
   determining deterioration of the light emitting device in accordance with the result of the comparison.

6. The deterioration estimating method according to claim 5, wherein the light emitting device comprises a laser diode.

7. The deterioration estimating method according to claim 5, wherein the average value of the temperature correction coefficients is 0.8.

8. The deterioration estimating method according to claim 5, wherein the value of n falls within a range of 1.2 to 1.3.

9. The deterioration estimating method according to claim 5, wherein the reference value is a driving current value with which the light emitting device can provide the predetermined light output at ordinary temperature.

10. A deterioration estimating method for estimating a state of deterioration of a light emitting device based on a driving current of the light emitting device, comprising the steps of:
    supplying a first driving current such that the light emitting device provides a predetermined light output, and setting the value of the first driving current as a reference value;
    obtaining a corrected reference value by adding a correction current value to the reference value, the correction current value being a temperature correction coefficient specific to the light emitting device;
    setting a driving current value which is n times the corrected reference value as a deterioration threshold current for determining the state of deterioration of the light emitting device;
    supplying a second driving current such that the light emitting device provides the predetermined light output, and comparing the value of the second driving current with the deterioration threshold current; and
    determining deterioration of the light emitting device in accordance with the result of the comparison.

11. The deterioration estimating method according to claim 10, wherein the light emitting device comprises a laser diode.

12. The deterioration estimating method according to claim 10, wherein the temperature correction coefficient η is given by the equation $$\eta = (IT2 - IT1)/(T2 - T1)$$

where IT1 is a driving current value at a first temperature T1, and IT2 is a driving current value at a second temperature T2 different from the first temperature T1.

13. The deterioration estimating method according to claim 10, wherein the value of n falls within a range of 1.2 to 1.3.

14. The deterioration estimating method according to claim 10, wherein the reference value is a driving current value with which the light emitting device can provide the predetermined light output at ordinary temperature.

15. A light emission driving apparatus for controlling a driving current of a light emitting device in such a manner that the light emitting device provides a given light output, comprising:

light detecting means for detecting the light output of the light emitting device;

comparing means for comparing an output of said light detecting means with a reference light output value of the light output of the light emitting device;

driving means for supplying a driving current to the light emitting device in accordance with an output of said comparing means, to thereby cause the light emitting device to provide a light output corresponding to the reference light output value;

current detecting means for detecting the value of the driving current;

temperature detecting means for detecting an operating temperature of the light emitting device; and control means for estimating deterioration of the light emitting device based on outputs of said current detecting means and said temperature detecting means, and stopping supply of the driving current to the light emitting device in accordance with the result of the estimation.

16. The light emission driving apparatus according to claim 15, wherein said control means supplies the reference light output value to said comparing means such that the light emitting device provides a predetermined light output, to thereby obtain a first driving current then supplied to the light emitting device based on the output of said current detecting means;

sets the value of the first driving current as a reference value;

calculates a temperature correction coefficient specific to the light emitting device based on the outputs of said current detecting means and said temperature detecting means;

derives a correction current value by using the calculated temperature correction coefficient;

obtains a corrected reference value by adding the correction current value to the reference value;

sets a driving current value which is n times the corrected reference value as a deterioration threshold current for determining the state of deterioration of the light emitting device;

supplies the reference light output value to said comparing means such that the light emitting device provides the predetermined light output, to thereby obtain a second driving current then supplied to the light emitting device based on the output of said current detecting means;

compares the value of the second driving current with the deterioration threshold current; and controls said driving means such that supply of the driving current to the light emitting device is stopped in accordance with the result of the comparison.

17. The light emission driving apparatus according to claim 16, wherein the temperature correction coefficient η is given by the equation $$\eta = (IT2 - IT1)/(T2 - T1)$$

where IT1 is a driving current value at a first temperature T1 obtained from the outputs of said current detecting means and said temperature detecting means, and IT2 is a driving current value at a second temperature T2 different from the first temperature T1.

18. The light emission driving apparatus according to claim 17, wherein the temperature correction coefficient η is stored in memory means by said control means.

19. The light emission driving apparatus according to claim 16, wherein the value of n falls within a range of 1.2 to 1.3.

20. The light emission driving apparatus according to claim 16, wherein the reference value is a driving current value with which the light emitting device can provide the predetermined light output at ordinary temperature.

21. The light emission driving apparatus according to claim 15, which further comprises display means, and wherein when the light emitting device is judged to be in a deteriorated state, said control means controls the display means so as to display information indicating the deterioration of the light emitting device.

22. The light emission driving apparatus according to claim 15, wherein the light emitting device comprises a laser diode.

* * * * *

UNITED STATES PATENT AND TRADEMARK OFFICE
CERTIFICATE OF CORRECTION

PATENT NO. : 5,625,616
DATED : April 29, 1997
INVENTOR(S) : SHIGEAKI KOIKE; MASARU TEZUKA; SHINJI KANEKO; YOSHIZO MIHARA It is certified that error appears in the above-indentified patent and that said Letters Patent is hereby corrected as shown below:

In columns 9 and 10, lines 5 and 25, respectively, after "$\eta = (IT2 - IT1)/(T2 - T1)$", please add --[mA/°C]--.

Signed and Sealed this

Twelfth Day of August, 1997

Attest:

BRUCE LEHMAN

Attesting Officer

Commissioner of Patents and Trademarks